(12) United States Patent
Park et al.

(10) Patent No.: US 8,120,534 B2
(45) Date of Patent: Feb. 21, 2012

(54) LINE STRUCTURE AND METHOD FOR MANUFACTURING THE SAME

(75) Inventors: Eun-seok Park, Suwon-si (KR); Jeong-hae Lee, Seoul (KR); Young-eil Kim, Suwon-si (KR); Jong-seok Kim, Hwaseong-si (KR); Ick-jae Yoon, Seoul (KR); Young-ho Ryu, Seoul (KR); Jae-hyun Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 918 days.

(21) Appl. No.: 12/042,402

(22) Filed: Mar. 5, 2008

(65) Prior Publication Data
US 2009/0108966 A1 Apr. 30, 2009

(30) Foreign Application Priority Data
Oct. 24, 2007 (KR) ........................ 10-2007-0107438

(51) Int. Cl.
*H01Q 1/38* (2006.01)
(52) U.S. Cl. ............................................... 343/700 MS
(58) Field of Classification Search .......... 343/700 MS, 343/878, 909
See application file for complete search history.

(56) References Cited

U.S. PATENT DOCUMENTS

| | | | | |
|---|---|---|---|---|
| 5,617,104 A | * | 4/1997 | Das ........................ | 343/700 MS |
| 5,965,494 A | * | 10/1999 | Terashima et al. ............ | 505/210 |
| 6,531,740 B2 | * | 3/2003 | Bosco et al. .................. | 257/347 |
| 6,713,389 B2 | * | 3/2004 | Speakman .................... | 438/674 |
| 6,934,519 B2 | * | 8/2005 | Kayano et al. ............. | 455/115.1 |
| 7,030,463 B1 | * | 4/2006 | Subramanyam et al. ..... | 257/595 |
| 7,190,317 B2 | * | 3/2007 | Werner et al. ................. | 343/745 |
| 2005/0253763 A1 | * | 11/2005 | Werner et al. ................. | 343/745 |
| 2006/0125052 A1 | * | 6/2006 | Moon et al. ................... | 257/595 |
| 2009/0174609 A1 | * | 7/2009 | Sanada ................. | 343/700 MS |

* cited by examiner

*Primary Examiner* — Huedung Mancuso
(74) *Attorney, Agent, or Firm* — NSIP Law

(57) ABSTRACT

A line structure is provided which includes a ferroelectric film which is formed on at least one surface of both sides of a substrate and a permittivity of which changes according to a magnitude of an applied voltage, an inductor which is formed on a first side of the substrate, and a capacitor which has a capacitance corresponding to the permittivity of the ferroelectric film and the substrate.

17 Claims, 8 Drawing Sheets

LINE STRUCTURE AND METHOD FOR MANUFACTURING THE SAME

CROSS-REFERENCE TO RELATED APPLICATIONS

This application claims the benefit under 35 U.S.C. §119 (a) of a Korean Patent Application No. 10-2007-0107438, filed on Oct. 24, 2007, in the Korean Intellectual Property Office, the disclosure of which is incorporated herein by reference in its entirety.

TECHNICAL FIELD

The following description relates to a line structure and a method of manufacturing the line structure, and more particularly, the description relates to a line structure capable of tuning to a frequency and steering a beam, and a method of manufacturing the line structure.

BACKGROUND

Information Technology (IT) technologies have developed over the years to remove limitations of time and space and provide users with desired information through micro-devices whenever and wherever they want.

Generally, such micro-devices each have a unique operating frequency, and require a minimum frequency band to transfer information. Accordingly, micro-devices require antennas supporting multi-bands, and it is desired that such antennas be manufactured smaller than conventional antennas.

Additionally, it is desired to fabricate antennas which support multi-bands due to the advent of applications such as mobile communications, ubiquitous sensor networks or bio-chips, and to fabricate micro-antennas having a beam steering function for radiating a main beam in a desired direction.

In recent years, antennas have become increasingly developed and studied using characteristics of a composite right/left-handed (CRLH) transmission line (TL). CRLH TL may be modeled as an equivalent circuit as shown in FIG. 1. In a conventional line structure, an electrode is connected to a ground through a via in order to form shunt $L_L$. Accordingly, a conventional line structure requires a component such as a via, which may be inappropriate to fabricate a micro-antenna.

SUMMARY

In one general aspect, there is provided a line structure which tunes to a frequency and steers a beam using a ferroelectric film, and a method of manufacturing the line structure.

In another general aspect, there is provided a line structure including a ferroelectric film which is formed on at least one surface of both sides of a substrate and the permittivity of which changes according to a magnitude of an applied voltage, an inductor which is formed on a first side of the substrate, and a capacitor which has a capacitance corresponding to the permittivity of the ferroelectric film and the substrate.

The capacitor may include a first electrode which is formed on the first side of the substrate, and a second electrode which is disposed on a second side of the substrate and which faces the first electrode, wherein the substrate and ferroelectric film are disposed between the first electrode and the second electrode.

The inductor may be connected to the first electrode on the first side of the substrate.

The inductor may have a meander or spiral shape.

The first electrode and the second electrode may have a rectangular shape.

The first electrode may have a rectangular pattern, and the second electrode may have an interdigital pattern.

The line structure may further include a ground terminal which is formed on the first side of the substrate. The inductor may be formed between the ground terminal and the first electrode.

The line structure may comprise a plurality of unit cells, each of which comprises the inductor and the capacitor. Slots may be formed between the plurality of unit cells.

In still another general aspect, there is provided a method for manufacturing a line structure, the method including stacking a metallic layer on a surface of a first side of a substrate and patterning the metallic layer to form at least one first electrode and at least one inductor, which are connected to each other, stacking a ferroelectric film on a surface of a second side of the substrate, and forming at least one second electrode so as to face the at least one first electrode on the ferroelectric film, to manufacture a capacitor having a capacitance corresponding to the permittivity of the ferroelectric film and the substrate.

The inductor may have a meander or spiral shape.

The first electrode and the second electrode may have a rectangular shape.

The first electrode may have a rectangular pattern, and the second electrode may have an interdigital pattern.

Other features and aspects may be from the following detailed description, the drawings, and the claims.

BRIEF DESCRIPTION OF THE DRAWINGS

Throughout the drawings and the detailed description, the same drawing reference numerals will be understood to refer to the same elements, features, and structures.

DETAILED DESCRIPTION

The following detailed description is provided to assist the reader in gaining a comprehensive understanding of the methods and systems described herein. Accordingly, various changes, modifications, and equivalents of the systems and methods described herein will be suggested to those of ordinary skill in the art. Also, descriptions of well-known functions and constructions are omitted to increase clarity and conciseness.

FIGS. 2A to 2G illustrate an example of a method for manufacturing a line structure 100.

Figure 1:
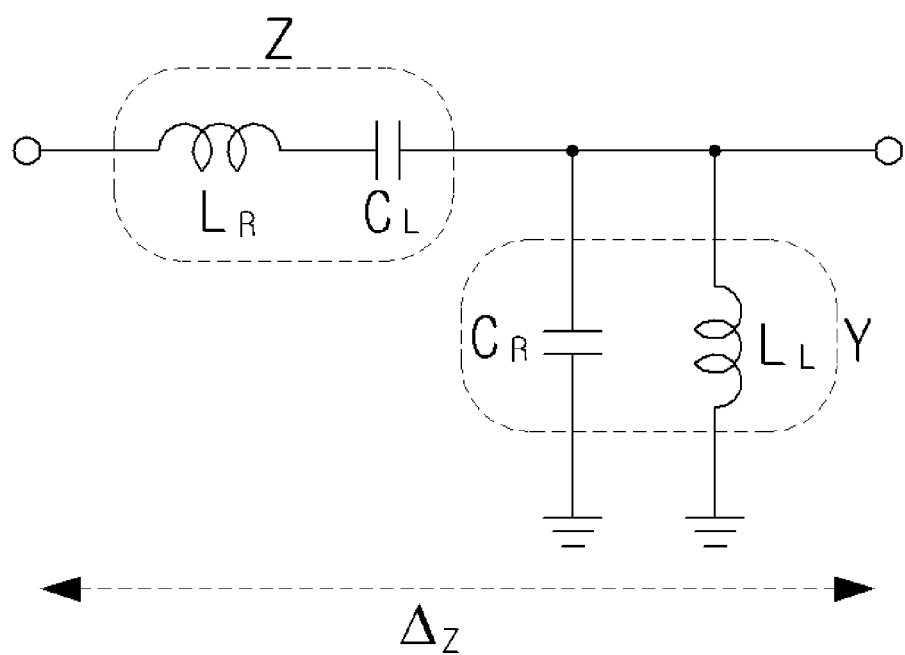
FIG. 1 is a circuit diagram showing a conventional equivalent circuit of a composite right/left-handed (CRLH) transmission line (TL).
Figure 2A:
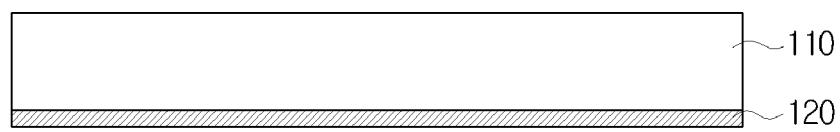
FIGS. 2A to 2G are sectional views showing an example of a method for manufacturing a line structure.
Figure 2B:
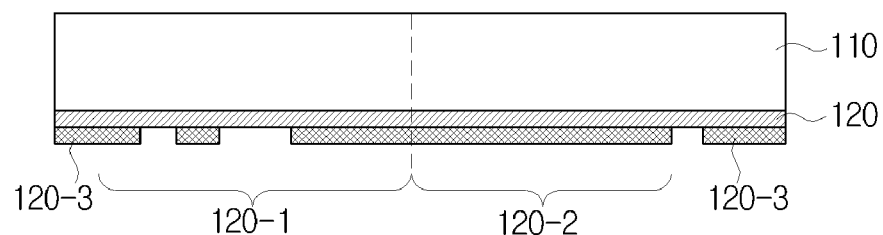
Figure 2C:
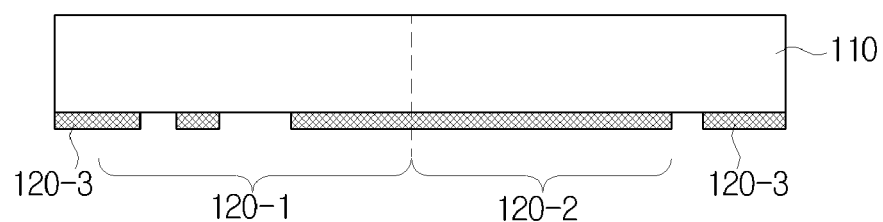

A metallic layer 120 is stacked on a surface of one side of a substrate 110, as shown in FIG. 2A, and a photoresist is coated thereon, as shown in FIG. 2B. An etching operation and a surface processing operation are performed to form an inductor 120-1, a first electrode 120-2 and a ground terminal 120-3, as shown in FIG. 2C. Here, the inductor 120-1 may have a meander or spiral form, and the first electrode 120-2 may have a rectangular shape.

Figure 2D:
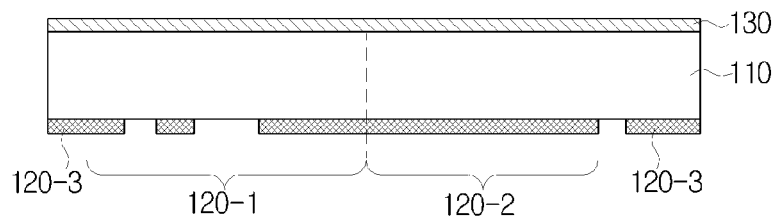

As shown in FIG. 2D, a ferroelectric film 130 is stacked on a surface of an opposite side of the substrate 110. Here, barium strontium titanate (BST) may be used as a ferroelectric. If BST is used as a ferroelectric, the Curie temperature may be adjusted and the ferroelectric film may have a high permittivity at a microwave frequency and low return loss. The ferroelectric film 130 may also be formed between the substrate 110 and the first electrode 120-2.

Figure 2E:
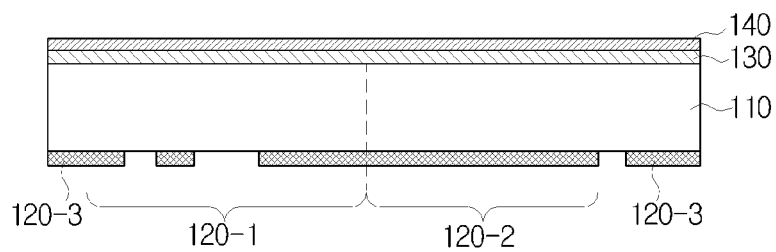
Figure 2F:
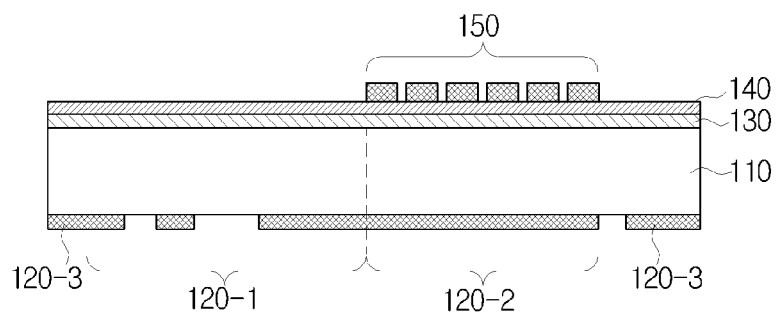
Figure 2G:
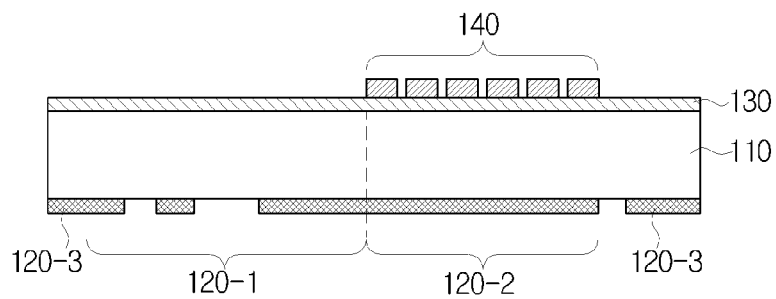

A metallic layer is stacked on the ferroelectric film 130, as shown in FIG. 2E, and a photoresist 150 is coated thereon, as shown in FIG. 2F. An etching operation and a surface processing operation are performed to form a second electrode 140 in a predetermined pattern, as shown in FIG. 2G. The second electrode 140 may be disposed facing the first electrode 120-2, and may have an interdigital pattern or a rectangular shape.

FIGS. 2A to 2G show a single unit cell of the line structure 100 fabricated as described above. The line structure 100 may include a plurality of unit cells, and the plurality of unit cells may be spaced apart at predetermined intervals to form a plurality of slots.

Figure 3A:
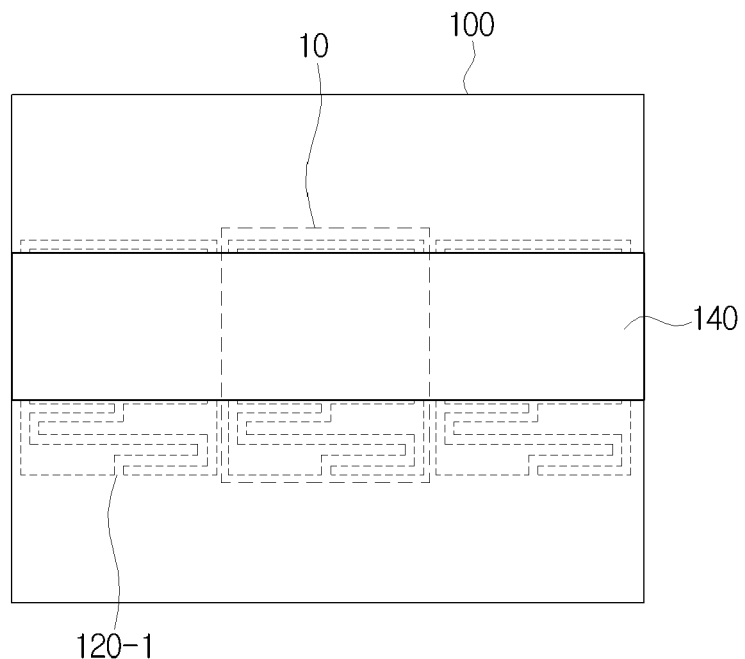
FIG. 3A is a perspective view showing an example of a top surface of a line structure.

FIG. 3A illustrates an example of a top surface of the line structure 100. In FIG. 3A, the second electrode 140 has a rectangular shape and is formed on the top of the line structure 100, and the meander-shaped inductor 120-1 is disposed on the bottom surface of the line structure 100.

The inductor 120-1 is not shown where the line structure 100 is viewed from above, because the inductor 120-1 is covered by the ferroelectric film 130 and the substrate 110. However, in FIG. 3A, which is a perspective view, the meander-shaped inductor 120-1 does not face the second electrode 140, and has a shunt inductance value. In this situation, the inductor 120-1 may have not only a meander shape but also a spiral shape.

The line structure 100 of FIG. 3A comprises three unit cells 10, but the number of unit cells is not limited.

Figure 3B:
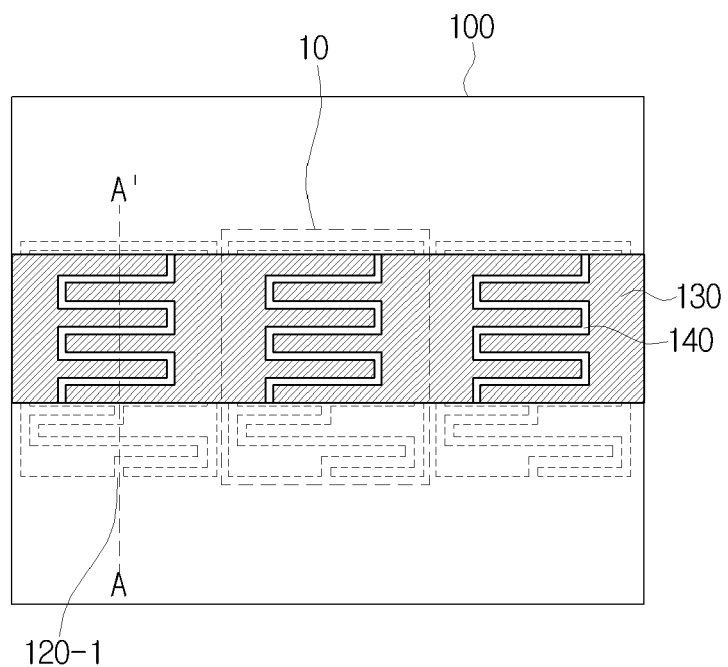
FIG. 3B is a perspective view showing another example of a top surface of a line structure.

FIG. 3B illustrates another example of a top surface of a line structure 100. Here, the second electrode 140 may have an interdigital pattern. Accordingly, where the line structure 100 is viewed from above, a portion of the ferroelectric film 130 may be shown below the second electrode 140 having the interdigital pattern.

Here, the inductor 120-1 is not shown where the line structure 100 is viewed from above, because the inductor 120-1 is covered by the ferroelectric film 140. However, FIG. 3B shows that the meander-shaped inductor 120-1 does not face the second electrode 140.

Figure 4:
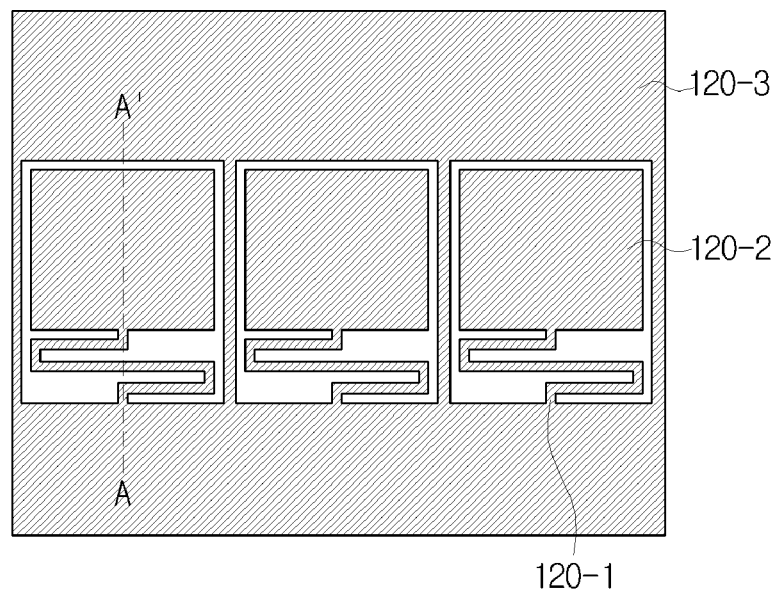
FIG. 4 is a view showing an example of a bottom surface of a line structure.

FIG. 4 illustrates an example of a bottom surface of the line structure 100. The first electrode 120-2 having a rectangular shape formed by etching, the inductor 120-1 connected to one end of the first electrode 120-2, and the ground terminal 120-3 are disposed below the line structure 100 of FIG. 4. In this situation, the first electrode 120-2 faces the second electrode 140 disposed on the top surface of the line structure 100, but the inductor 120-1 does not face the second electrode 140.

Accordingly, the first electrode 120-2 and the inductor 120-1 shown in FIG. 4 and the second electrode 140 shown in FIG. 3A may form a single line structure 100.

Figure 5:
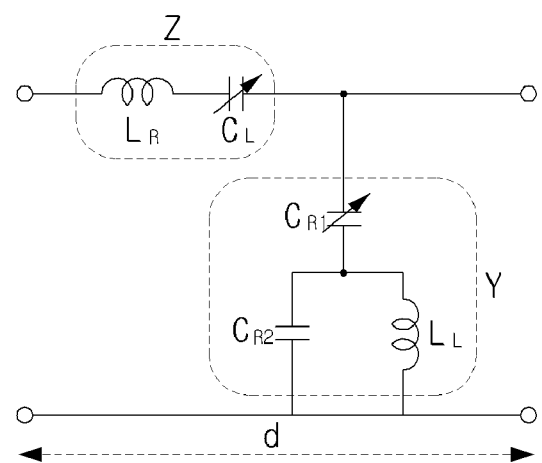
FIG. 5 is a circuit diagram showing an example of an equivalent circuit of a line structure.

FIG. 5 illustrates an example of an equivalent circuit of a line structure. Here, for convenience of description, the configuration of FIGS. 2G and 5 will be described.

FIG. 2G shows a section of the line structure 100 cut along line A-A' of FIGS. 3B and 4. The line structure 100 of FIG. 2G includes the inductor 120-1, the first electrode 120-2 and ground terminal 120-3 which are disposed below the substrate 110, the ferroelectric film 130 which is disposed on the substrate 110, and the second electrode 140, which is disposed on the ferroelectric film 130 and faces the first electrode 120-2. The first electrode 120-2 may have a rectangular shape, and the second electrode 140 may have an interdigital pattern.

A series capacitance $C_L$ per unit length d shown in FIG. 5 required to implement the composite right/left-handed (CRLH) characteristic is created using the interdigital type second electrode 140. Additionally, a shunt inductance $L_L$ per unit length d shown in FIG. 5 is created using the meander-shaped inductor 120-1.

A shunt capacitance $C_{R2}$ per unit length d is created between the first electrode 120-2 and the ground terminal 120-3, and a shunt capacitance $C_{R1}$ per unit length d is created between the first electrode 120-2 and the second electrode 140. Additionally, a series inductance $L_R$ per unit length d is created by electric current flowing through the interdigital type second electrode 140. The line structure 100 may be operated in the same manner as a CRLH transmission line (TL) structure.

The CRLH TL structure may have zeroth-order resonance (ZOR), and an omni-radiation pattern. Additionally, the resonant frequency is independent of the size of the cells, and it is possible to realize multiple resonances according to the number of cells.

Accordingly, in examples described herein, it is possible to obtain the shunt inductance $L_L$ even where the line structure 100 does not include a via, and the line structure 100 may thus be simplified. Additionally, a large inductance value may be obtained, and it is easy to control the resonant frequency.

According to other examples described herein, the line structure 100 may be a multi-band antenna capable of tuning to a resonant frequency using the ferroelectric film 130. Here, the line structure 100 may include an input port. For convenience of description, the configuration of FIGS. 2G and 5 will be described.

In an example of the multi-band antenna capable of tuning to a resonant frequency, a voltage is applied to the line structure 100 shown in FIG. 2G via the input port. The permittivity of the ferroelectric film 130 may change according to the magnitude of the applied voltage. Additionally, the series capacitance $C_L$ and shunt capacitance $C_{R1}$ shown in FIG. 5 may also be varied according to the changed permittivity, and the resonant frequency may thus change.

Figure 6:
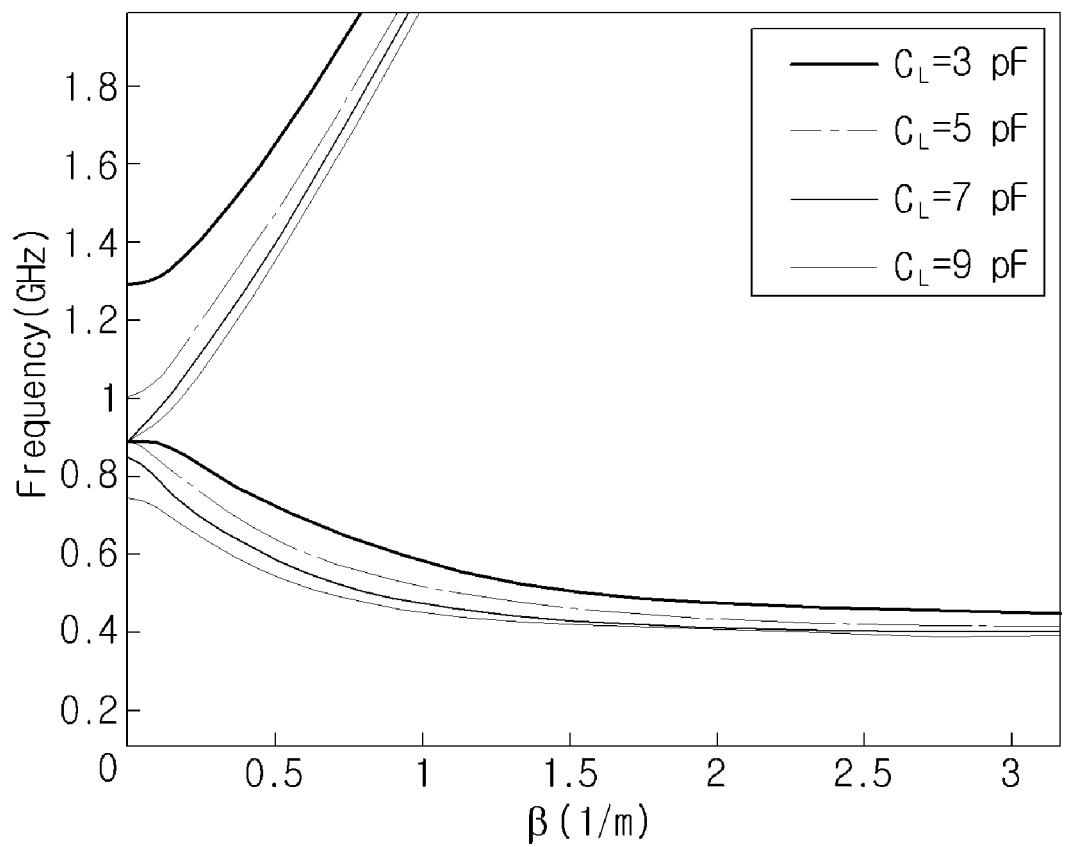
FIG. 6 is a graph showing an example of dispersion curves of the frequency-tuning characteristic of a line structure.

FIG. 6 shows examples of dispersion curves of the frequency-tuning characteristic of a line structure. The vertical axis of the graph of FIG. 6 represents the resonant frequency changed according to a change in the capacitance $C_L$, and the horizontal axis of the graph of FIG. 6 represents the phase constant $\beta$.

If the phase constant $\beta$ is 0, that is, if both the permittivity and magnetic permeability are 0, the resonant frequency can be tuned from approximately 0.9 GHz to 1.3 GHz according to the change in the capacitance $C_L$. Therefore, the capacitance values continue to be varied using the ferroelectric film, so it is possible to tune to the resonant frequency.

Where the line structure 100 includes a plurality of unit cells, the tunable frequency band may be broadened. Accordingly, a multi-band capable of providing various services may be used.

Both the permittivity and magnetic permeability in the CRLH TL structure have negative values. Accordingly, if a radiation angle Θ is approximately 0°, a beam may be radiated in a broadside array, and if a radiation angle Θ is approximately 90°, a beam may be radiated in an endfire array. Additionally, if a radiation angle Θ is approximately −90°, a beam may be radiated in a backfire array. In this situation, the beams may be radiated via slots formed between the unit cells.

According to other examples described herein, the line structure 100 may be a leaky wave antenna capable of steering a beam using the ferroelectric film 130. Here, the line structure 100 may include an input port and an output port. The phase constant β of the leaky wave antenna may be changed according to the capacitance $C_L$ and capacitance $C_{R1}$ changed according to a change in the permittivity of the ferroelectric film, so the leaky wave antenna can control the direction of the radiated beam.

Figure 7:
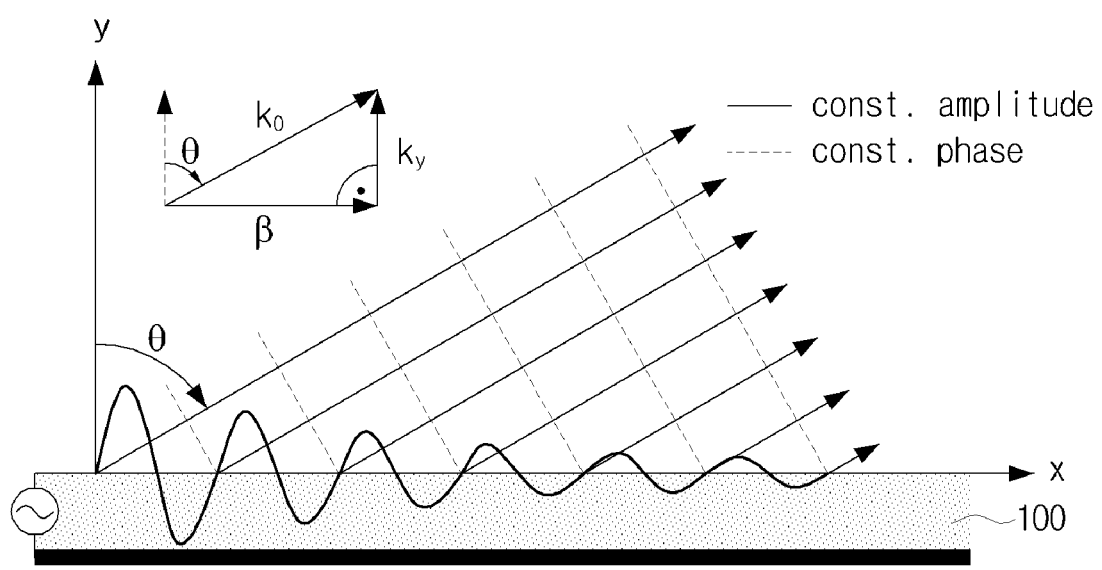
FIGS. 7 and 8 are graphs showing examples of the beam steering characteristic of a line structure.
Figure 8:
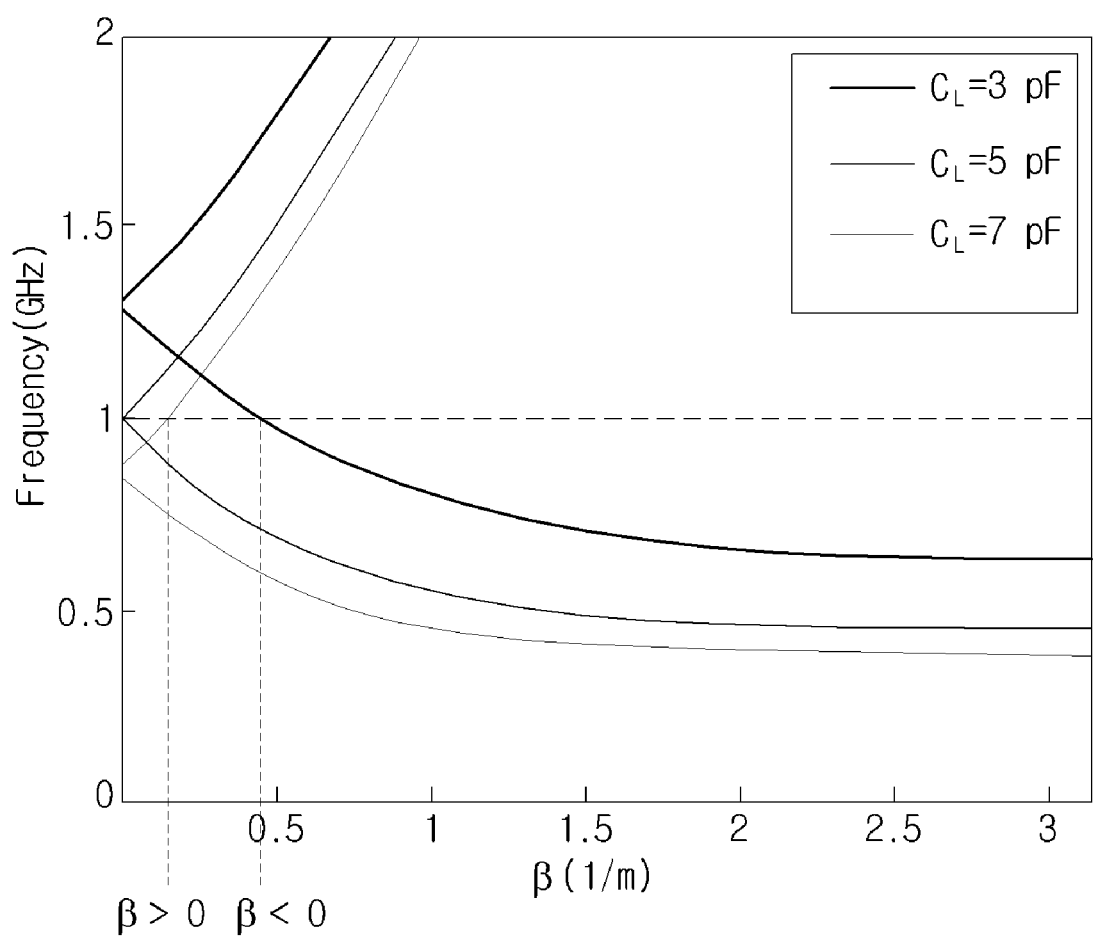

FIGS. 7 and 8 illustrate examples of the beam steering characteristic of a line structure. Where the X axis of the graph of FIG. 7 represents the longitudinal direction of the line structure 100, and the Y axis represents a direction perpendicular to the top surface of the line structure 100, a beam radiation angle Θ of the line structure 100 may range between approximately 90° clockwise and approximately 90° counterclockwise on the Y axis on the X-Y plane. In this situation, the phase constant β may be adjusted to change the radiation angle Θ. Additionally, where the phase constant β is equal to or less than 0, a backward wave may be generated.

The vertical axis of the graph of FIG. 8 represents the resonant frequency changed according to a change in the capacitance $C_L$, and the horizontal axis represents the phase constant β. If a frequency in a service band is approximately 1 GHz, the phase constant β may be adjusted from a negative to a positive value, and may be zero. Specifically, if the capacitance $C_L$ is approximately 3 pF, the phase constant β is approximately −0.5 (1/m), if the capacitance $C_L$ is approximately 5 pF, the phase constant β is approximately 0 (1/m), and if the capacitance $C_L$ is approximately 7 pF, the phase constant β is approximately 0.2 (1/m).

The capacitance values may thus be changed using the ferroelectric film, so the phase constant β may be regulated.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A line structure comprising:
a ferroelectric film which is formed on at least one surface of both sides of a substrate and which has a permittivity of which changes according to a magnitude of an applied voltage;
an inductor which is formed on a first side of the substrate; and
a capacitor which has a capacitance corresponding to the permittivity of the ferroelectric film and the substrate, the capacitor comprising:
a first electrode which is formed on the first side of the substrate; and
a second electrode which is disposed on a second side of the substrate and which faces the first electrode,
wherein the substrate and the ferroelectric film are disposed between the first electrode and the second electrode; and
wherein the substrate and the ferroelectric film are separate from each other.

2. The line structure of claim 1, wherein the inductor is connected to the first electrode on the first side of the substrate.

3. The line structure of claim 2, wherein the inductor has a meander or spiral shape.

4. The line structure of claim 1, wherein the first electrode and the second electrode have a rectangular shape.

5. The line structure of claim 2, wherein the first electrode has a rectangular pattern, and the second electrode has an interdigital pattern.

6. The line structure of claim 2, further comprising:
a ground terminal which is formed on the first side of the substrate,
wherein the inductor is formed between the ground terminal and the first electrode.

7. The line structure of claim 1, wherein the substrate is disposed between the ferroelectric film and the first electrode.

8. The line structure of claim 1, wherein the ferroelectric film is disposed between the substrate and the second electrode.

9. A line structure comprising:
a ferroelectric film which is formed on at least one surface of both sides of a substrate and which has a permittivity of which changes according to a magnitude of an applied voltage;
an inductor which is formed on a first side of the substrate;
a capacitor which has a capacitance corresponding to the permittivity of the ferroelectric film and the substrate; and
a plurality of unit cells, each of which comprises the inductor and the capacitor, the capacitor comprising:
a first electrode which is formed on the first side of the substrate; and
a second electrode which is disposed on a second side of the substrate and which faces the first electrode,
wherein the substrate and the ferroelectric film are disposed between the first electrode and the second electrode; and
wherein slots are formed between the plurality of unit cells.

10. A method for manufacturing a line structure, the method comprising:
stacking a metallic layer on a surface of a first side of a substrate;
patterning the metallic layer to form at least one first electrode and at least one inductor, which are connected to each other;
stacking a ferroelectric film on a surface of a second side of the substrate; and
manufacturing a capacitor having a capacitance corresponding to a permittivity of the ferroelectric film, and the substrate, the manufacturing of the capacitor comprising forming at least one second electrode on the ferroelectric film so as to face the at least one first electrode, wherein the substrate and the ferroelectric film are separate from each other.

11. The method of claim 10, wherein the inductor has a meander or spiral shape.

12. The method of claim 10, wherein the at least one first electrode and the at least one second electrode have a rectangular shape.

13. A method for manufacturing a line structure, the method comprising:
    stacking a metallic layer on a surface of a first side of a substrate;
    patterning the metallic layer to form at least one first electrode and at least one inductor, which are connected to each other;
    stacking a ferroelectric film on a surface of a second side of the substrate; and
    manufacturing a capacitor having a capacitance corresponding to a permittivity of the ferroelectric film, and the substrate, the manufacturing of the capacitor comprising forming at least one second electrode on the ferroelectric film so as to face the at least one first electrode, wherein the at least one first electrode has a rectangular pattern, and the at least one second electrode has an interdigital pattern.

14. A line structure, comprising:
    an inductor, a first electrode, and a ground terminal disposed on a first side of a substrate;
    a ferroelectric film disposed on a second side of the substate, and has a permittivity that changes according to a magnitude of an applied voltage; and
    a second electrode facing the first electrode, the second electrode being disposed on the ferroelectric film,
    wherein the substrate and the ferroelectric film are disposed between the first electrode and the second electrode; and
    wherein the substrate and the ferroelectric film are separate from each other.

15. The line structure of claim 14, wherein the inductor is formed between the ground terminal and the first electrode and has a meander or spiral shape.

16. A line structure, comprising:
    an inductor, a first electrode, and a ground terminal disposed on a first side of a substrate;
    a ferroelectric film disposed on a second side of the substate, and has a permittivity that changes according to a magnitude of an applied voltage; and
    a second electrode facing the first electrode, the second electrode being disposed on the ferroelectric film, wherein:
    the first electrode is formed as a rectangle; and
    the second electrode is formed having an interdigital pattern.

17. A line structure, comprising:
    an inductor, a first electrode, and a ground terminal disposed on a first side of a substrate;
    a ferroelectric film disposed on a second side of the substate, and has a permittivity that changes according to a magnitude of an applied voltage; and
    a second electrode facing the first electrode, the second electrode being disposed on the ferroelectric film, wherein:
    the second electrode is configured to create:
        a series capacitance with respect to a length of the line structure; and
        a shunt capacitance between the first electrode with respect to the length of the line structure; and
    the series capacitance and the shunt capacitance correspond to the permittivity of the ferroelectric film and the substrate.

* * * * *